US008034686B2

(12) United States Patent
Hsieh

(10) Patent No.: US 8,034,686 B2
(45) Date of Patent: Oct. 11, 2011

(54) METHOD OF MANUFACTURING A TRENCH MOSFET HAVING TRENCH CONTACTS INTEGRATED WITH TRENCH SCHOTTKY RECTIFIERS HAVING PLANAR CONTACTS

(75) Inventor: Fu-Yuan Hsieh, Kaohsiung (TW)

(73) Assignee: Force Mos Technology Co., Ltd., Kaohsiung (TW)

( * ) Notice: Subject to any disclaimer, the term of this patent is extended or adjusted under 35 U.S.C. 154(b) by 0 days.

(21) Appl. No.: 12/838,707

(22) Filed: Jul. 19, 2010

(65) Prior Publication Data
US 2010/0279478 A1 Nov. 4, 2010

Related U.S. Application Data

(62) Division of application No. 12/385,891, filed on Apr. 23, 2009, now Pat. No. 7,791,136.

(51) Int. Cl.
*H01L 21/336* (2006.01)

(52) U.S. Cl. .................. 438/270; 438/259; 257/328

(58) Field of Classification Search .................. 438/259, 438/270; 257/328, 329, 330, 331, E21.41
See application file for complete search history.

(56) References Cited

U.S. PATENT DOCUMENTS

| 5,917,216 | A | 6/1999 | Floyd et al. | |
|---|---|---|---|---|
| 7,078,781 | B2 * | 7/2006 | Hatakeyama et al. | 257/472 |
| 7,436,022 | B2 * | 10/2008 | Bhalla et al. | 257/328 |
| 7,626,231 | B1 | 12/2009 | Hsieh | |
| 2010/0140695 | A1 * | 6/2010 | Yedinak et al. | 257/334 |

* cited by examiner

*Primary Examiner* — Phuc Dang
(74) *Attorney, Agent, or Firm* — Bacon & Thomas, PLLC

(57) ABSTRACT

An integrated configuration comprising trench MOSFET having trench contacts and trench Schottky rectifier having planar contacts is disclosed. The trench contacts for trench MOSFET provide a lower specific on-resistance. Besides, for trench gate connection, planar gate contact is employed in the present invention to avoid shortage issue between gate and drain in shallow trench gate. Besides, W plugs filled into both trench contacts and planar contacts enhance the metal step coverage capability.

2 Claims, 12 Drawing Sheets

METHOD OF MANUFACTURING A TRENCH MOSFET HAVING TRENCH CONTACTS INTEGRATED WITH TRENCH SCHOTTKY RECTIFIERS HAVING PLANAR CONTACTS

This is a divisional application of and claims the benefit of the earlier filing date of U.S. patent application Ser. No. 12/385,891, filed Apr. 23, 2009, now U.S. Pat. No. 7,791,136. The entire disclosure of the pending, prior application is hereby incorporated by reference.

FIELD OF THE INVENTION

This invention relates generally to the cell structure and device configuration of semiconductor devices. More particularly, this invention relates to an improved trench MOSFET configuration having trench contacts integrated with trench Schottky rectifiers having planar contacts.

BACKGROUND OF THE INVENTION

The trench Schottky rectifiers have been added externally in parallel to a semiconductor power device, e.g., a power trench MOSFET device for higher efficiency DC/DC applications. In parallel with the parasitic PN body diode, the trench Schottky rectifier acts as clamping diode to prevent the body diode from turning on. Therefore, many kinds of configuration have been proposed in prior arts to integrate the trench MOSFET and the trench Schottky rectifier on a single substrate.

FIG. 1A shows the side cross-section of an integration configuration of a prior art (U.S. Pat. No. 6,351,018) wherein both trench MOSFET and trench Schottky rectifier are sharing a common trench gate. As shown in FIG. 1A, The disclosed integration configuration is formed on an N doped substrate 102. A plurality of trenches are etched inside the substrate 102 and filled with doped poly within trenches to serve as trench gates 106 and 106' over a layer of gate oxide 104. Between trench gates 106', trench Schottky rectifier 110 is formed with a space width of W. Near the top surface of P well regions 108 in trench MOSFET, N+ source regions 112 are implanted adjacent to the sidewalls of trench gates. Body regions 114 heavily doped with P doping type are formed inside the P well regions 108. Metal layer 120 is connected to source regions 112, body regions 114 in trench MOSFET and is connected to anode of trench Schottky rectifiers via planar contacts 116 and 118, respectively.

Another integration configuration was proposed in U.S. Pat. No. 6,593,620 where trench MOSFET and trench Schottky rectifier have separated trench gates, as shown in FIG. 1B. The integration configuration comprising a DMOS transistor 220 and a trench Schottky rectifier 222 further includes an N+ substrate 200 onto which a lighter N doped epitaxial layer 202 is grown. A plurality of trench gates 210 are formed into the epitaxial layer 202 with gate oxide 206 padded on the filling-in material. The DMOS transistor 220 further comprises P body region 204 extending between trench gates 210 with N+ source regions 212 near its top surface adjacent to the sidewalls of trench gates. A metal layer 216 is connected to source regions 212, body regions 204 in DMOS transistor and is connected to anode of trench Schottky rectifier via planar contact. An insulating layer 235 is deposited on top of the trench gates 210 of the DMOS transistor 220 to isolate the metal layer 216 from the trench gates 210. On the rear side of wafer, metal layer 230 is deposited to act as a common drain contact for DMOS transistors and as a common cathode electrode for trench Schottky rectifiers.

Both structures mentioned above can achieve the integration of trench MOSFET and trench Schottky rectifier on a single substrate, but it's should be noticed that, planar contacts are employed in both trench MOSFET and trench Schottky rectifier to contact the source regions and the body regions with source metal, and to contact the anode with anode metal, respectively. Especially for trench MOSFET, the planar contact will limit device shrinkage because that, the planar contact occupies a large area, resulting in a high specific on-resistance in trench MOSFET.

Another constraint of the prior art is that, please refer to FIGS. 1A and 1B, metal step coverage of the prior arts will become poor if single metal is used to fill the planar contact when the planar contact dimension is shrunk.

Accordingly, it would be desirable to provide new and improved device configuration to avoid the high specific on-resistance caused by planar contact in trench MOSFET while having a better metal step coverage capability.

SUMMARY OF THE INVENTION

It is therefore an object of the present invention to provide new and improved device configuration to solve the problems discussed above.

One aspect of the present invention is that, trench contact is used in trench MOSFET portion for source-body trench contact. By employing the source-body trench contact, the devices are able to be shrunk to achieve a low specific on-resistance for trench MOSFET, therefore solving the main problem.

Another aspect of the present invention is that, planar contact is provided for trench gate connection, resulting a better metal step coverage capability than prior art, and on the other hand, avoiding gate-drain shortage caused by over-etching when using trench contact for shallow trench gate.

Another aspect of the present invention is that, W (tungsten) plugs are filled into all contact trenches, including trench contacts and planar contacts, to act as contact material, and therefore improves the metal step coverage and further enhances cell density for on-resistance reduction.

Briefly, in a preferred embodiment, as shown in FIG. 2, the present invention discloses an integration configuration in parallel with a wider common trench gate formed on a substrate heavily doped with a first semiconductor doping type, e.g., N+ dopant. Onto the substrate, an epitaxial layer lighter doped with the same doping type as substrate is grown, inside which a plurality of trench gates and a wider common trench gate are formed with a gate oxide between filling-in material and the inner surface of gate trenches. The integration configuration further comprises: a trench MOSFET and a trench Schottky rectifier. The trench MOSFET further comprises: body regions of a second semiconductor doping type, e.g., P dopant, extending between trench gates with source regions heavily doped with a first semiconductor doping type near its top surface; source-body trench contacts filled with W plugs padded with a barrier layer of Ti/TiN or Co/TiN or Mo/TiN penetrating through an thick oxide interlayer and the source regions, and extending into the body regions; a body contact resistance reduction area heavily doped with the second doping type around the bottom of each said source-body trench contact to further reduce contact resistance. The trench Schottky rectifier further comprises: planar contacts filled with W plugs padded with the barrier layer penetrating through the thick oxide interlayer to the top surface of the epitaxial layer between trench gates. In common trench gate portion, the planar gate contact is provided penetrating through the thick oxide interlayer and touching to the top surface of the common trench gate. Above the thick oxide interlayer and said W plugs, a resistance-reduction metal layer of Ti or Ti/TiN is deposited and then a metal layer of Al alloys or Cu. The metal layers are finally patterned to form gate metal for the common trench gate and source metal for trench MOSFET which is also functioning as anode metal for trench Schottky rectifier. The gate metal is connected to the common trench gate via said planar gate contact, the source metal for trench MOSFET is connected to the source regions and the body regions via said source-body trench contacts, and the anode metal for trench Schottky rectifier is connected to the anode via said planar contacts. Especially, the trench gates in trench Schottky rectifier is not shorted with the anode.

Briefly, in another preferred embodiment, as shown in FIG. 3, the present invention discloses an integration configuration in parallel with a wider trench gate for trench MOSFET gate connection, and the disclosed configuration is formed on a substrate heavily doped with a first semiconductor doping type, e.g., N+ dopant. Onto the substrate, an epitaxial layer lighter doped with the same doping type as substrate is grown, inside which a plurality of trench gates and a wider trench gate for trench MOSFET gate connection are formed with a gate oxide between filling-in material and the inner surface of gate trenches. The integration configuration further comprises: a trench MOSFET and a trench Schottky rectifier. The trench MOSFET further comprises: body regions of a second semiconductor doping type, e.g., P dopant, extending between trench gates with source regions heavily doped with a first semiconductor doping type near its top surface adjacent to the sidewalls of the trench gate; source-body trench contacts filled with W plugs padded with a barrier layer of Ti/TiN or Co/TiN or Mo/TiN penetrating through an thick oxide interlayer, the source regions and extending into the body regions; a body contact resistance reduction area heavily doped with the second doping type around the bottom of each said source-body trench contact to further reduce contact resistance. The trench Schottky rectifier further comprises: planar contacts filled with W plugs padded with the barrier layer penetrating through the thick oxide interlayer and touching to the top surface of the epitaxial layer and the top surface of the trench gates to contact trench gates in trench Schottky rectifier with its anode. In the wider trench gate portion which is for trench MOSFET gate connection, a planar gate contact is provided penetrating through the thick oxide interlayer and touching to the top surface of the wider trench gate for trench MOSFET gate connection. Above the thick oxide interlayer and the W plugs, a resistance-reduction metal layer of Ti or Ti/TiN is deposited and then metal layer of Al alloys or Cu. The metal layers are finally patterned to form gate metal for trench MOSFET gate connection and source metal for trench MOSFET which is also functioning as anode metal for trench Schottky rectifier. The gate metal is connected to trench gate for trench MOSFET gate connection via said planar gate contact, the source metal for trench MOSFET is connected to the source regions and the body regions via said source-body trench contacts, and the anode metal for trench Schottky rectifier is connected to trench gate in trench Schottky rectifier and the anode via said planar contacts. Especially, the trench gates in trench Schottky rectifier is not connected with the trench gate in trench MOSFET but shorted with the anode.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1A:
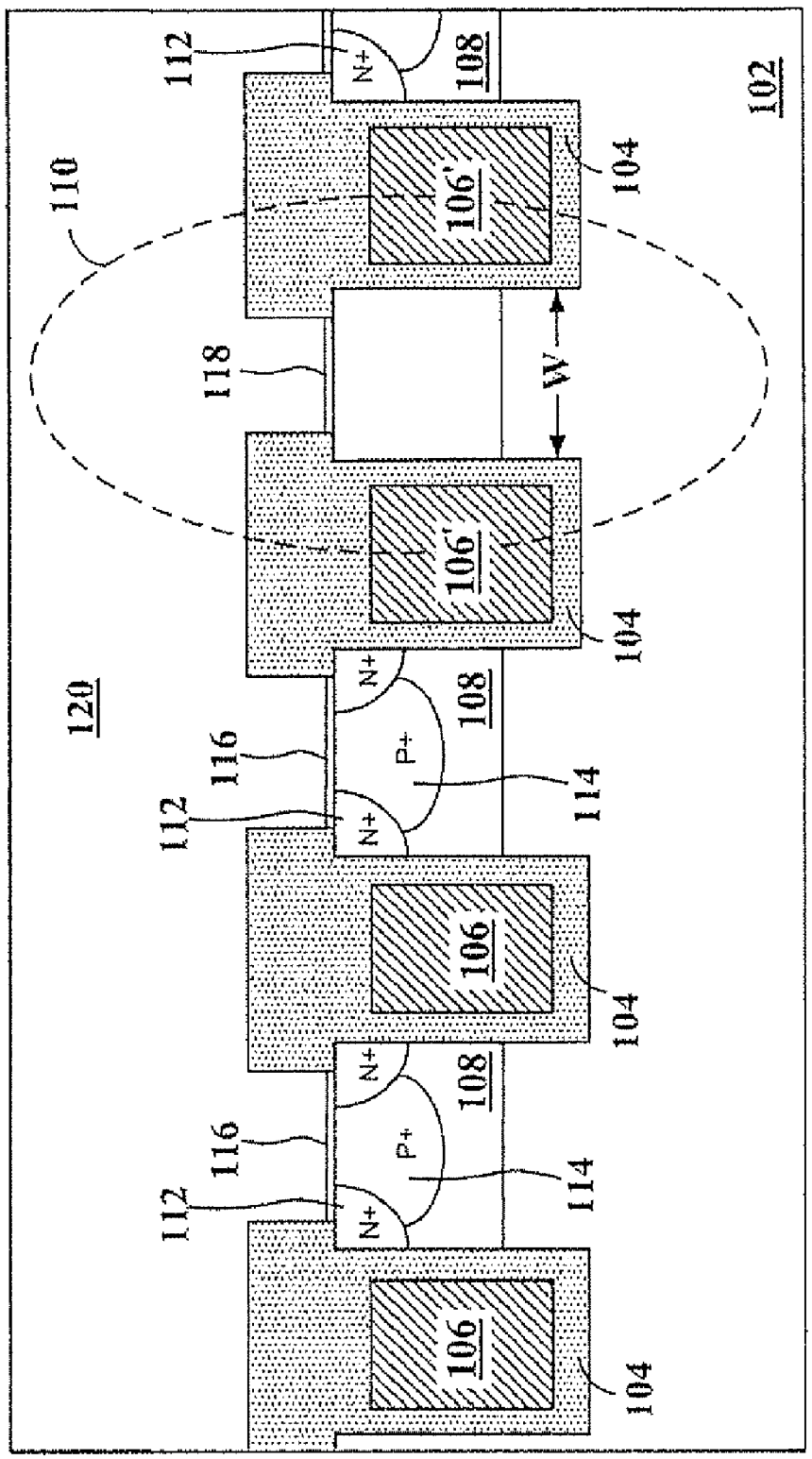
FIG. 1A is a side cross-sectional view of a prior art.
Figure 1B:
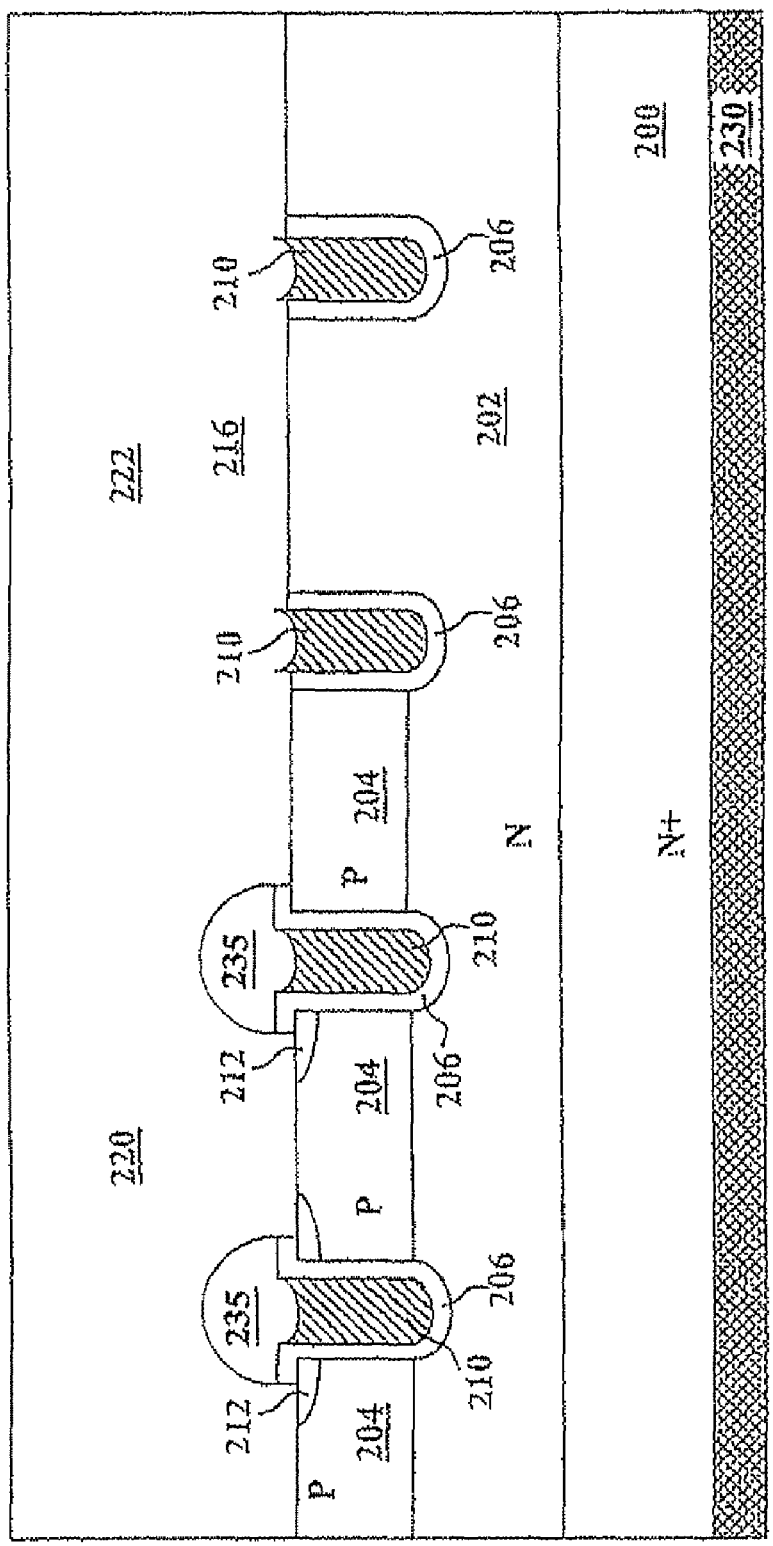
FIG. 1B is a side cross-sectional view of another prior art.
Figure 2:
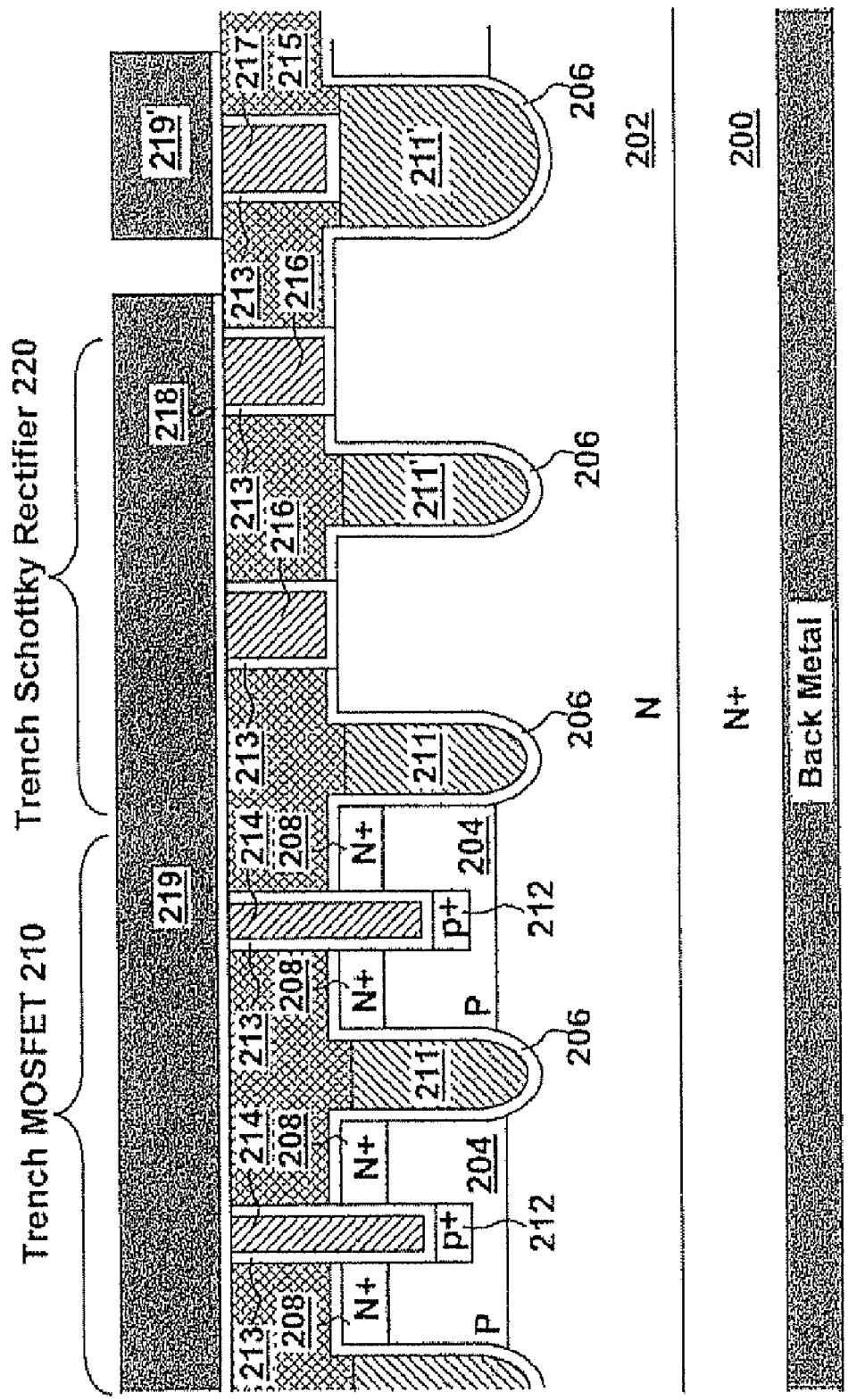
FIG. 2 is a side cross-sectional view of an embodiment according to the present invention.

Please refer to FIG. 2 for a preferred embodiment of the present invention where an N-channel trench MOSFET 210 is integrated with a trench Schottky rectifier 220 in parallel with a wider common trench gate. The integrated configuration is formed on an N+ substrate 200 onto which a lighter N doped epitaxial layer 202 is grown. Into the epitaxial layer 202, a plurality of gate trenches and a wider gate trench for common trench gate are etched and filled with doped poly padded with a layer of gate oxide 206 to serve as trench gates 211 for trench MOSFET 210 and trench Schottky rectifier 220, and a wider trench gate 211' for common trench gate, respectively. In trench MOSFET 210, P body regions 204 are extending between two adjacent trench gates 211 with N+ source regions 208 near the top surface; source-body trench contacts 214 filled with W plug which is padded with a barrier layer 213 of Ti/TiN or Co/TiN or Mo/TiN are formed by penetrating through a thick oxide interlayer 215 and the source regions 208, and extending into the P body regions 204; p+ body contact resistance reduction areas 212 are implanted around the bottom of each said source-body trench contact to further reduce contact resistance. In trench Schottky rectifier 220, planar contacts 216 filled with W plug which is padded with the barrier layer 213 are formed by penetrating through the thick oxide interlayer 215 and touching to the top surface of the epitaxial layer 202 between trench gates 211 or further extending into the epitaxial layer with a depth in the epitaxial layer less than 0.1 um due to dry over etching of the thick oxide interlayer. In common trench gate portion, planar gate contact 217 filled with W plug which is padded with the barrier layer 213 is formed by penetrating through the thick oxide interlayer 215 and touching to the top surface of the wider common trench gate 211' or further extending into the doped poly with a depth in the doped poly less than 0.2 um due to dry over etching of the thick oxide interlayer. Onto a resistance-reduction metal layer 218 of Ti or Ti/TiN which is deposited over the thick oxide interlayer 215 and said W plug, a metal layer 219 and 219' composed of Al alloys or Cu are formed. Specifically, the metal layer 219 is serving as source metal for trench MOSFET 210 and also the anode metal for trench Schottky rectifier 220, metal layer 219' is serving as common gate metal for both trench MOSFET 210 and trench Schottky rectifier 220.

Figure 3:
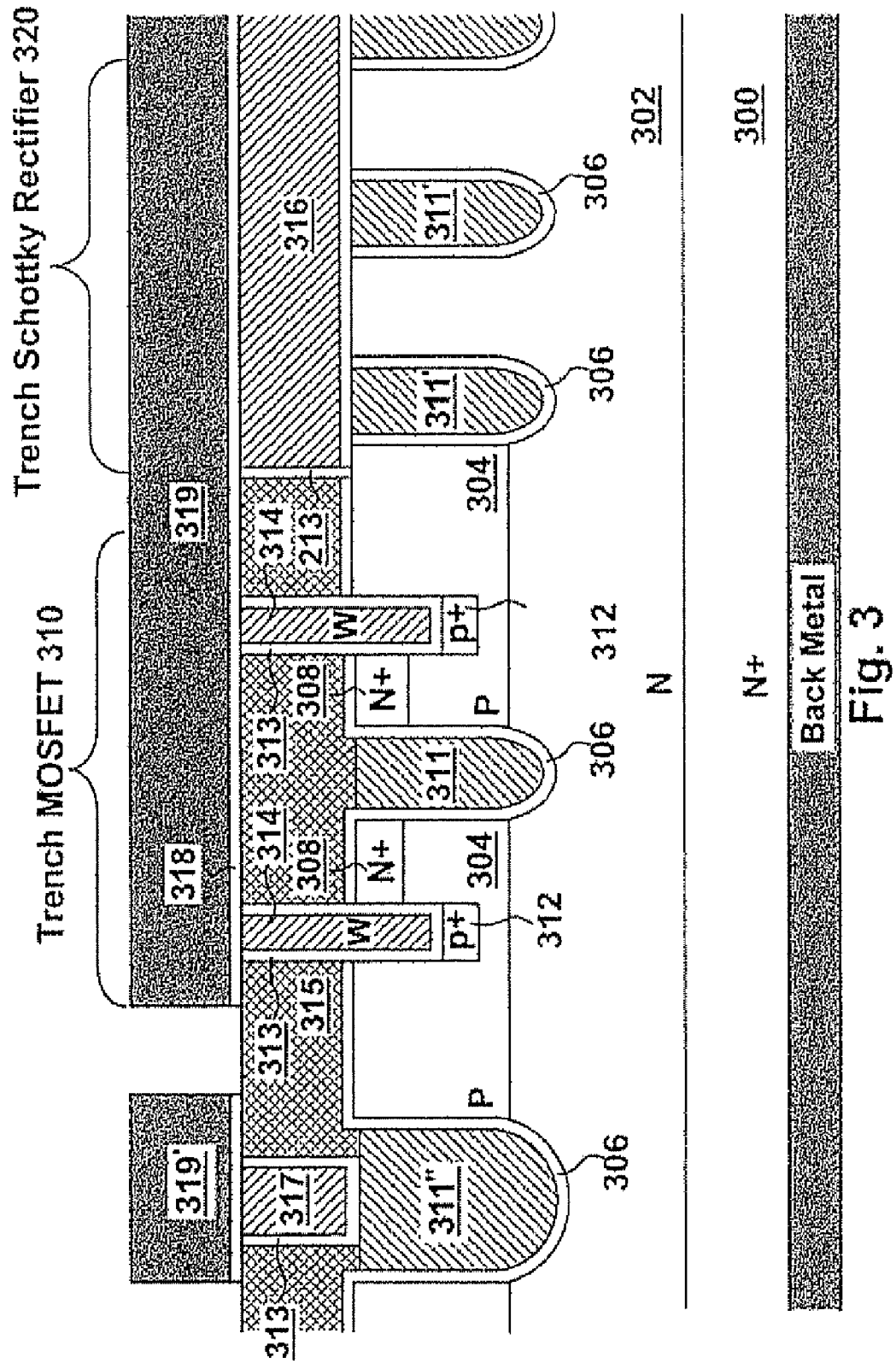
FIG. 3 is a side cross-sectional view of another embodiment according to the present invention.

Please refer to FIG. 3 for another preferred embodiment of the present invention where an N-channel trench MOSFET 310 is integrated with a trench Schottky rectifier 320 in parallel with a wider trench gate for trench MOSFET gate connection. The integrated configuration is formed on an N+ substrate 300 onto which a lighter N doped epitaxial layer 302 is grown. Into the epitaxial layer 302, a plurality of gate trenches and a wider gate trench are etched and filled with doped poly padded with a layer of gate oxide 306 to serve as trench gates 311 for trench MOSFET, trench gates 311' for trench Schottky rectifier and a wider trench gate 311" for trench MOSFET gate connection. In trench MOSFET 310, P body regions 304 are extending between trench gates with N+ source regions 308 near its top surface adjacent to the sidewalls of trench gate 311; source-body trench contacts 314 filled with W plug which is padded with a barrier layer 313 of Ti/TiN or Co/TiN or Mo/TiN are formed by penetrating through a thick oxide interlayer 315 and the source regions 308, and extending into the P body regions 304; p+ body contact resistance reduction areas 312 are implanted around the bottom of each said source-body trench contact to further reduce contact resistance. In trench Schottky rectifier 320, planar contacts 316 filled with W plug which is padded with the barrier layer 313 are formed by penetrating through the thick oxide interlayer 315 and touching to the top surface of the epitaxial layer 302 and the top surface of trench gates 311' or further extending into the epitaxial layer 302 with a depth less than 0.1 um and into trench gate 311' with a depth less than 0.2 um due to dry over etching of the thick oxide interlayer 315. In wider trench gate 311" portion which is for trench MOSFET gate connection, planar gate contact 317 filled with W which is padded with the barrier layer 313 is formed by penetrating through 215 and touching to the top surface of the wider trench gate 311" or further extending into trench gate 311" with a depth in doped poly layer less than 0.2 um due to dry over etching of the thick oxide interlayer 315. Onto a resistance-reduction metal layer 318 of Ti or Ti/TiN which is deposited over the thick oxide interlayer 315 and said W plug, metal layers 319 and 319' composed of Al alloys or Cu are formed. Specifically, metal layer 319 is serving as source metal for trench MOSFET 310 and also the anode metal for trench Schottky rectifier 320, metal layer 319' is serving as gate metal for trench MOSFET 310. And different from the first embodiment, the trench gates 311' in trench Schottky rectifier in this embodiment is not connected with the trench gate in trench MOSFET but shorted with the anode.

Figure 4A:
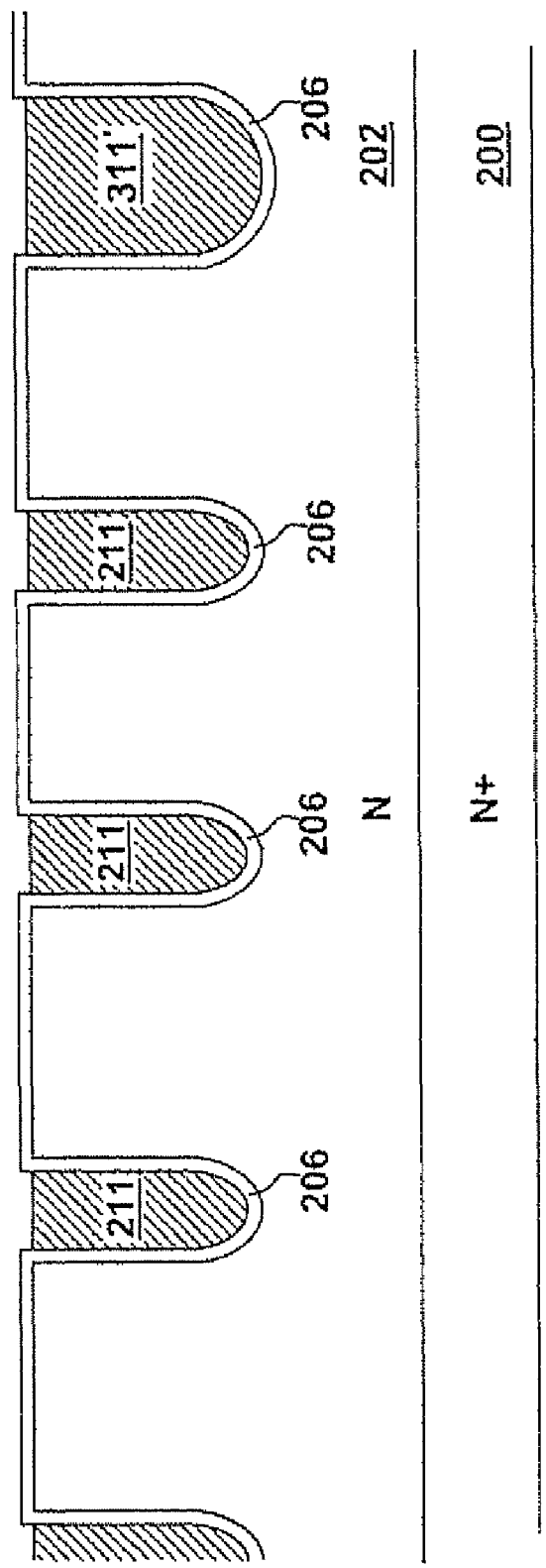
FIGS. 4A to 4E are a serial of side cross-sectional views for showing the processing steps for fabricating the integrated configuration as shown in FIG. 2.

FIGS. 4A to 4E are a serial of exemplary steps that are performed to form the inventive integrated configuration of FIG. 2. In FIG. 4A, an N doped epitaxial layer 202 is grown on an N+ substrate 200. A trench mask (not shown) is employed to define a plurality of gate trenches for trench MOSFET and trench Schottky rectifier, and a wider gate trench for common trench gate. Then, these gate trenches are dry Si etched to a certain depth. After that, a sacrificial oxide layer is grown and then removed to eliminate the plasma damage may introduced during etching process. Next, a first insulation layer is deposited overlying the inner surface of all the gate trenches to serve as gate oxide 206 onto which doped poly is deposited within gate trenches and then etched back or CMP (Chemical Mechanical Polishing) to form trench gates 211 for both trench MOSFET and trench Schottky rectifier, and a wider common trench gate 211'.

Figure 4B:
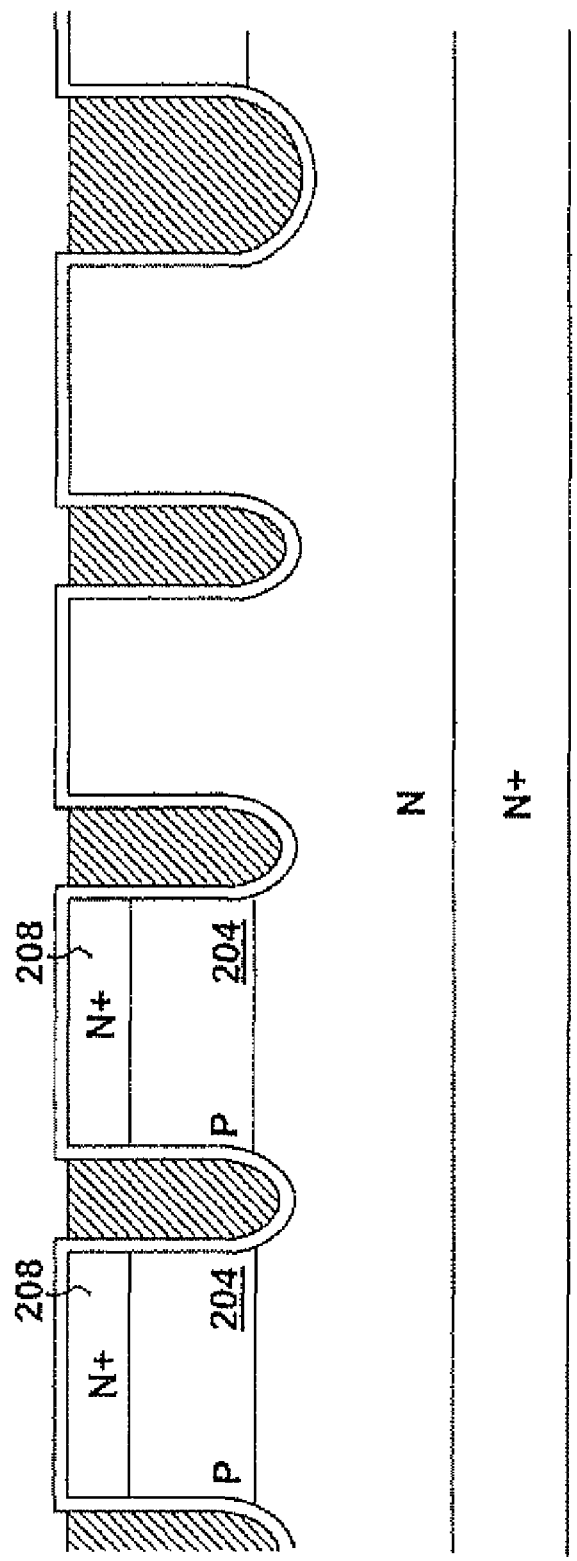

In FIG. 4B, a body mask (not shown) is applied to define body regions and followed by a step of P dopant Ion implantation for the formation of P body regions 204, and then a step for P body regions drive-in is carried out. After the removal of body mask, source mask (not shown) is applied to define source regions and followed by a step of N+ dopant Ion Implantation for the formation of N+ source regions 308, and then a step for N+ source regions drive-in is carried out.

Figure 4C:
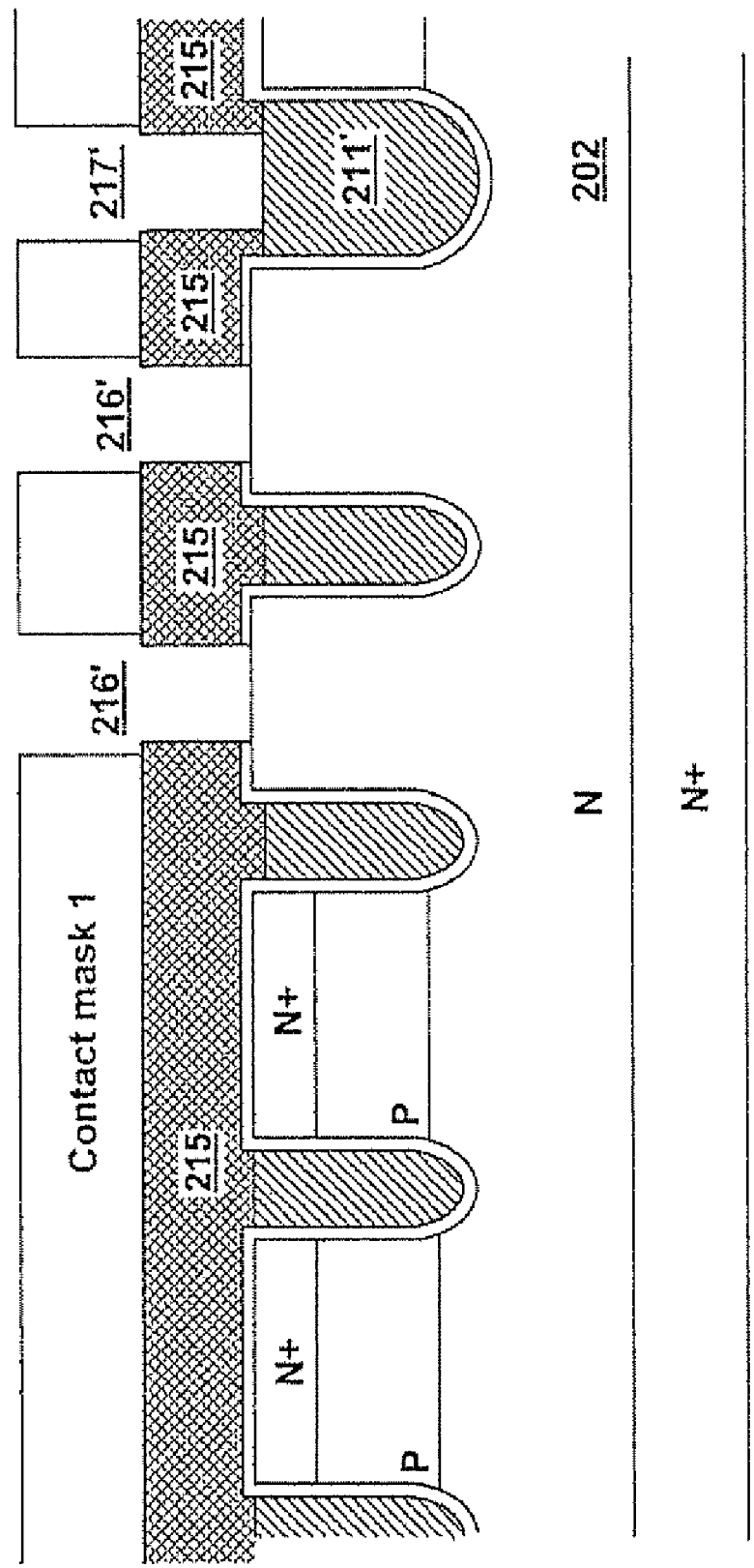

In FIG. 4C, the process continues with the deposition of a second insulation layer over entire front surface to act as a thick oxide interlayer 215. Then, a contact mask 1, as illustrated, is applied to carry out planar contact etch to open the contact trenches by applying a dry oxide etching through 215. For trench Schottky rectifier, the contact trenches are etched to the front surface of the epitaxial layer between trench gates to define the planar contact trench 216' for trench Schottky rectifier. For common trench gate, the contact trench is etched to the top surface of the common trench gate 211' to define the planar contact trench 217' for common trench gate.

Figure 4D:
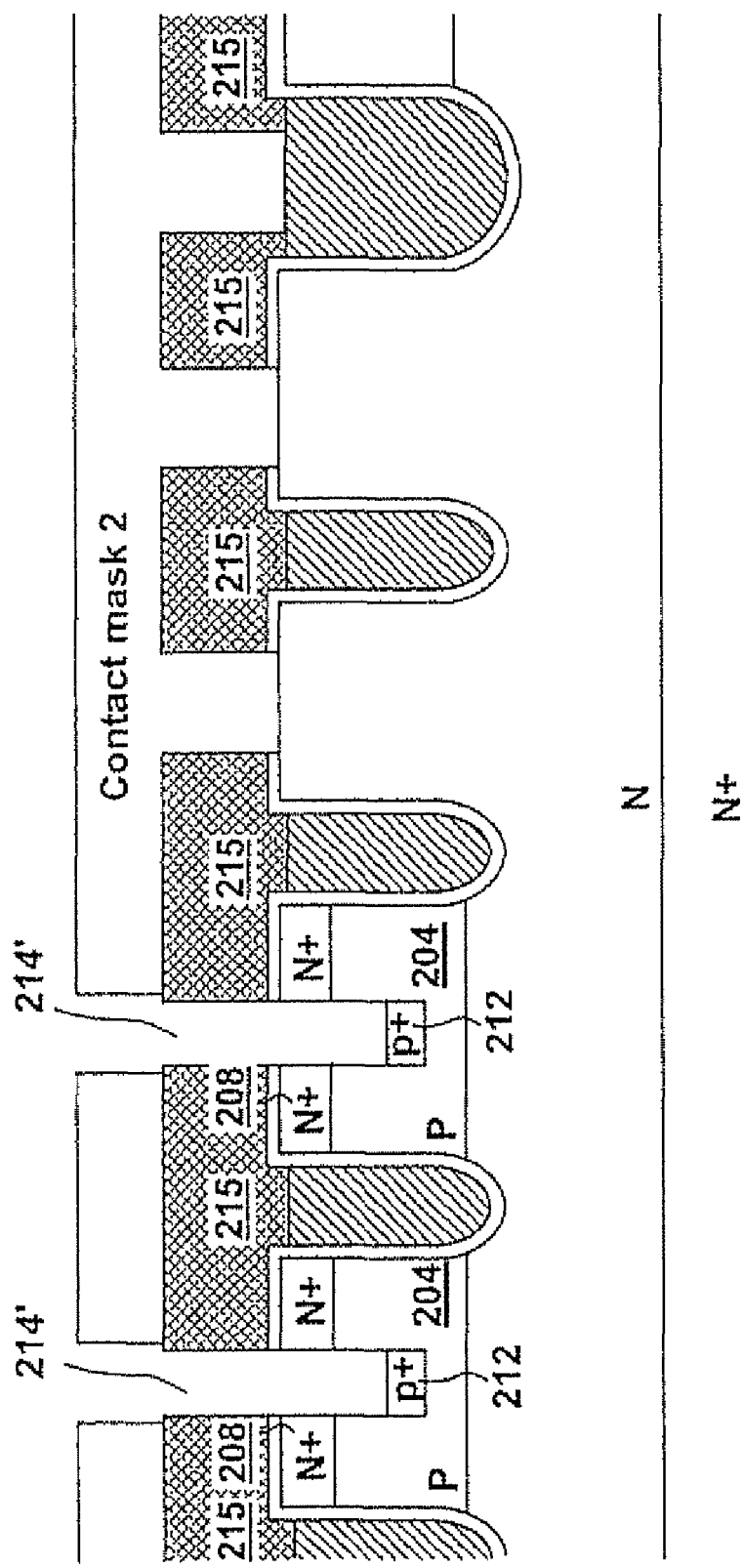

In FIG. 4D, after the removal of contact mask 1, a contact mask 2, as illustrated, is applied to carry out trench contact etch to open the contact trenches 214' for trench MOSFET by applying a dry oxide etching and a successively dry Si etching. The contact trenches 214' is penetrating through the thick oxide interlayer 215 and the N+ source regions 208 and into the P body regions 204. Then, in order to form the contact area 212 around the bottom of each the contact trench 214', a BF2 Ion Implantation of a P dopant is carried out, and then followed by a step of RTA (Rapid Thermal Annealing, 900~1000° C. for 15~60 sec) to activate BF2 dopant after removing the contact mask 2.

Figure 4E:
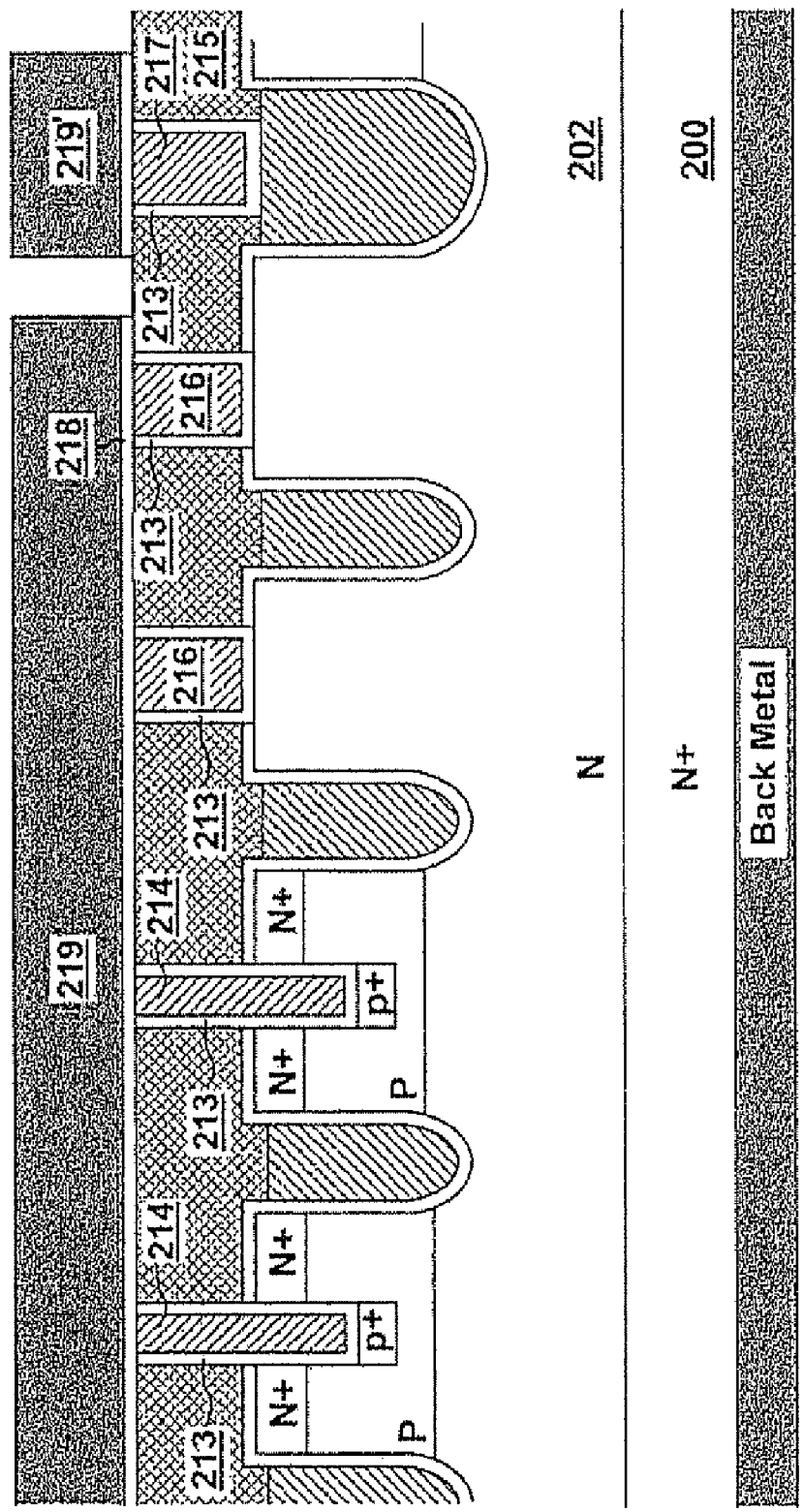

In FIG. 4E, the inner surface of all contact trenches, including contact trenches for planar contacts and trench contacts, are lined by a barrier layer 213 composed of Ti/TiN or Co/TiN or Mo/TiN. And a step of RTA (700~800° C. for 15~60 sec) is performed to form silicide. Then, onto the barrier layer 213, tungsten material are deposited to fill all said contact trenches, and followed by a step of tungsten and barrier layer etching back or CMP to form source-body trench contact 214 for trench MOSFET, planar contact 216 for trench Schottky rectifier and planar gate contact 217 for common trench gate. Then, over entire top surface, a resistance-reduction metal layer 218 composed of Ti or Ti/TiN and a metal layer of Al alloys or Cu are successively deposited. After that, a metal mask (not shown) is applied to pattern the metal layer into 219 and 219' by dry metal etching. Especially, metal layer 219 is functioning as source metal for trench MOSFET and also anode metal for trench Schottky rectifier, metal layer 219' is functioning as gate metal for common trench gate.

Figure 5A:
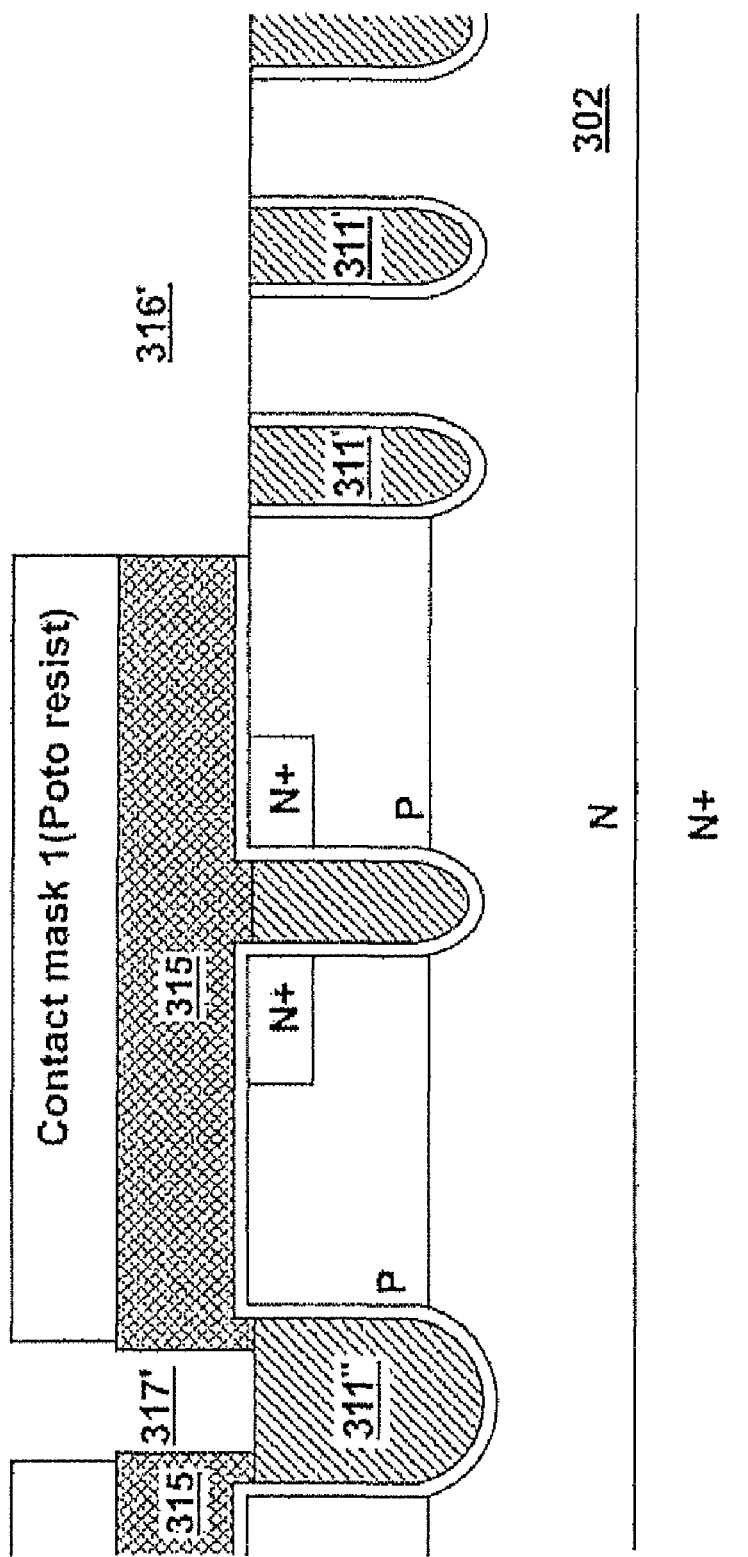
FIGS. 5A to 5C are a serial of side cross-sectional views for showing the processing steps for fabricating the integrated configuration as shown in FIG. 3.
Figure 5B:
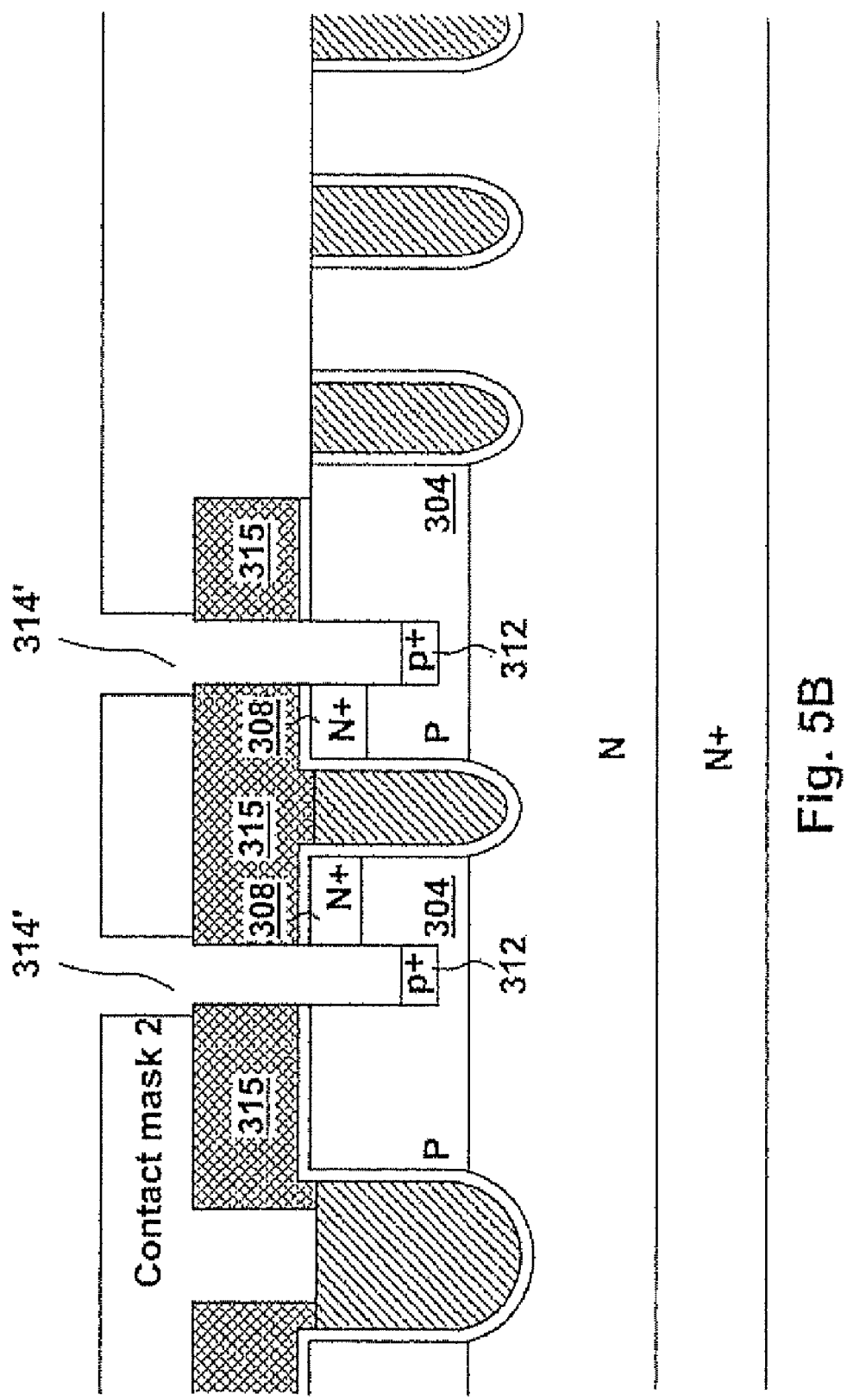
Figure 5C:
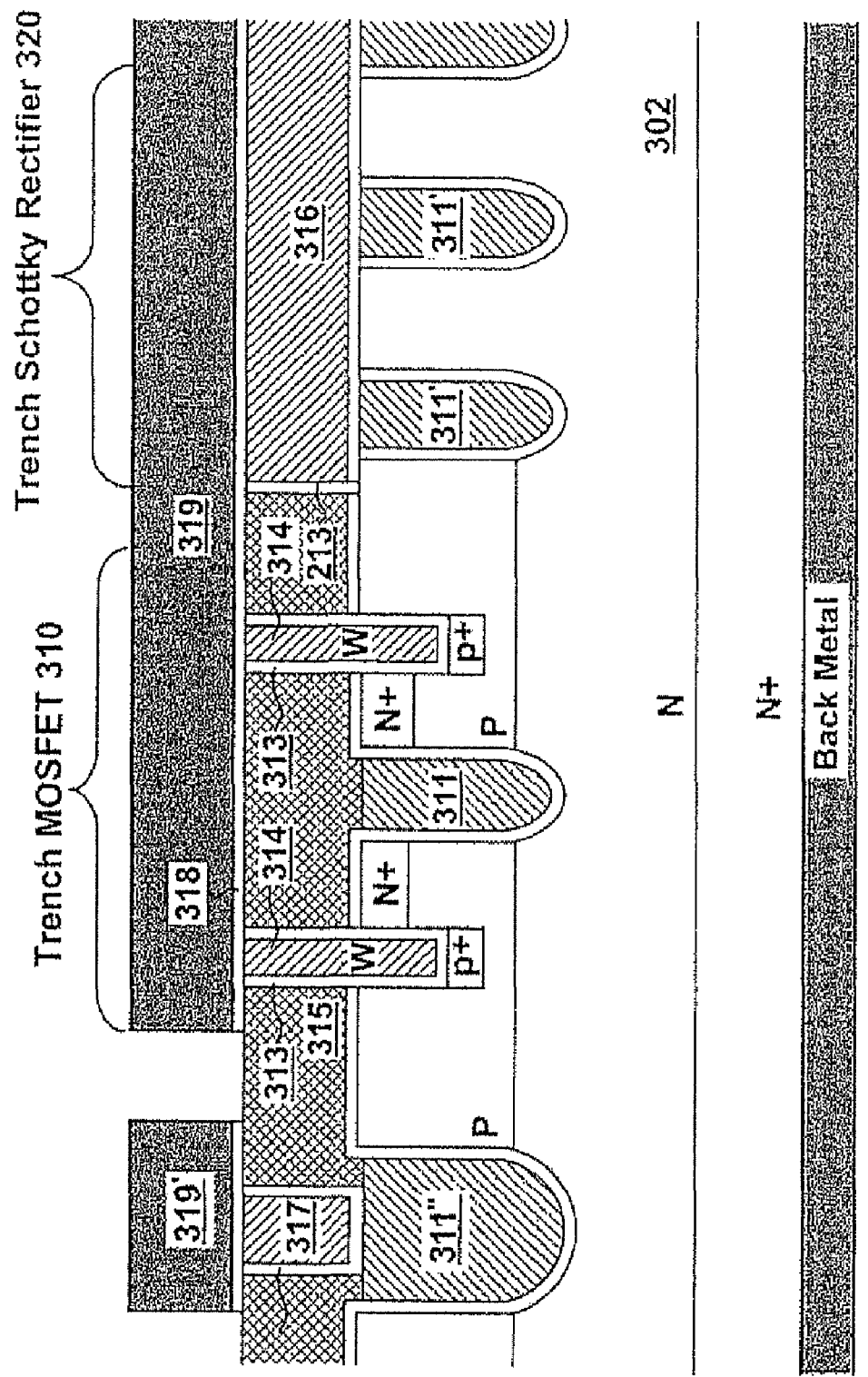

FIGS. 5A to 5C are a serial of exemplary steps that are performed to form the inventive integrated configuration of FIG. 3. In FIG. 5A, before the deposition of the second insulation layer, all steps are just the same as steps in FIGS. 4A and 4B. After the deposition of the second insulation layer, which is serving as the thick oxide interlayer 315, a contact mask 1, as illustrated, is applied to carry out planar contact etch to open the contact trenches by applying a dry oxide etching through 315. For trench Schottky rectifier, the contact trench is etched to expose the front surface of epitaxial layer 302 and top surface of trench gates 311' to form the planar contact trench 316'. For the wider trench gate, the contact trench is etched to the top surface of the wider trench gate 311" to form the planar gate contact trench 317' for trench MOSFET gate connection. In FIG. 5B, after the removal of contact mask 1, a contact mask 2, as illustrated, is applied to carry out trench contact etch to open the contact trenches 314' for trench MOSFET by applying a dry oxide etching and a successively dry Si etching. The contact trenches 314' is penetrating through the thick oxide interlayer 315 and the N+ source regions 308 and into the P body regions 304. Then, in order to form the contact area 312 around the bottom of each said contact trench 314', a BF2 Ion Implantation of a P dopant is carried out, and then followed by a step of RTA (Rapid Thermal Annealing, 900~1000° C. for 15~60 sec) to activate BF2 dopant after removing the contact mask 2.

In FIG. 5C, the inner surface of all contact trenches, including trenches for planar contacts and trench contacts, are lined by a barrier layer 313 composed of Ti/TiN or Co/TiN or Mo/TiN. And a step of RTA (700~800° C. for 15~60 sec) is performed to form silicide. Then, onto the barrier layer 313, tungsten material are deposited to fill all said contact trenches, and followed by a step of tungsten and barrier layer CMP (not etching back) to form source-body trench contact 314 for trench MOSFET, planar contact 316 for trench Schottky rectifier and planar gate contact 317 for trench MOSFET gate connection. Then, over entire top surface, a resistance-reduction metal layer 318 composed of Ti or Ti/TiN and a metal layer of Al alloys or Cu are successively deposited. After that, a metal mask (not shown) is applied to pattern the metal layer into 319 and 319' by dry metal etching. Especially, metal layer 219 is functioning as source metal for trench MOSFET and also anode metal for trench Schottky rectifier, metal layer 219' is functioning as gate metal for trench MOSFET, and the trench gates 311' in trench Schottky rectifier is not connected to the trench gates in trench MOSFET but shorted with the anode.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A method for manufacturing an N-channel integrated configuration comprising a plurality of trench MOSFETs having trench contacts and a plurality of trench Schottky rectifiers having planar contacts further comprising the steps of:

growing a lighter N doped epitaxial layer upon a heavily N doped substrate;
applying a trench mask with open and closed areas on the surface of said epitaxial layer;
removing semiconductor material from exposed areas of said trench mask to form a plurality of gate trenches and at least a wider gate trench for common trench gate;
growing a sacrificial oxide layer onto the surface of the all the gate trenches to remove the plasma damage;
removing said sacrificial oxide and trench mask and depositing a first insulation layer along the inner surface of all the gate trenches;
depositing doped poly into all the gate trenches;
etching back or CMP the doped poly;
applying a body mask and implanting said epitaxial layer with P type dopant to form P body regions;
removing the body mask and diffusing the P type dopant;
applying a source mask implanting said epitaxial layer with N+ type dopant to form N+ source regions;
removing the source mask and diffusing the N+ type dopant;
depositing a second insulating layer along the top surface of the epitaxial layer;
applying a first contact mask;
etching said second insulating layer from exposed areas of the first contact mask to form a plurality of trench contacts for trench Schottky rectifier and common trench gate;
removing the first contact mask and applying a second contact mask instead;
etching said second insulating layer and the N+ source regions and into the P body regions by successively dry oxide etching and dry Si etching to form a plurality of source-body trench contacts;
removing the second contact mask and ion implanting the epitaxial layer with BF2;
activating BF2 dopant by RTA under 900~1000° C. for 15~60 sec;
depositing a barrier layer along inner surface of all the contact trenches;
forming silicide by RTA under 700~800° C. for 15~60 sec;
depositing a W layer into all the contact trenches and etching back or CMP said W and said barrier layer;
depositing a resistance-reduction metal layer onto said W layer and said second insulating layer;
depositing a source metal layer onto front side;
applying a metal mask to pattern front metal layer into source metal (or anode metal) and gate metal;
depositing a drain metal on rear side of wafer after backside grinding.

2. A method for manufacturing an N-channel integrated configuration comprising a plurality of trench MOSFETs having trench contacts and a plurality of trench Schottky rectifiers having planar contacts further comprising the steps of:

growing a lighter N doped epitaxial layer upon a heavily N doped substrate;
applying a trench mask with open and closed areas on the surface of said epitaxial layer;
removing semiconductor material from exposed areas of said trench mask to form a plurality of gate trenches and at least a wider gate trench for trench MOSFET gate connection;
growing a sacrificial oxide layer onto the surface of the all the gate trenches to remove the plasma damage;
removing said sacrificial oxide and the trench mask and depositing a first insulation layer along the inner surface of all the gate trenches;
depositing doped poly into all the gate trenches;
etching back or CMP the doped poly;
applying a body mask and implanting said epitaxial layer with P type dopant to form P body regions;
removing the body mask and diffusing the P type dopant;
applying a source mask implanting said epitaxial layer with N+ type dopant to form N+ source regions;
removing said source mask and diffusing the N+ type dopant;
depositing a second insulating layer along the top surface of the epitaxial layer;
applying a first contact mask;
etching said second insulating layer from exposed areas of first contact mask to form at least a planar contact for anode and trench gates of trench Schottky rectifier, and the wider trench gate of trench MOSFET, respectively;
removing said first contact mask and applying a second contact mask instead;
etching said second insulating layer and the N+ source regions and into P body regions by successively dry oxide etching and dry Si etching to form a plurality of trench contacts for trench MOSFET;
removing said second contact mask and ion implanting the epitaxial layer with BF2;
activating BF2 dopant by RTA under 900~1000° C. for 15~60 sec;

depositing a barrier layer along inner surface of all the contact trenches;

forming silicide by RTA under 700~800° C. for 15~60 sec;

depositing a W layer into all the contact trenches and CMP W and said barrier layer;

depositing a resistance-reduction metal layer onto said W layer and said second insulating layer;

depositing a source metal layer onto front side;

applying a metal mask to pattern front metal layer into source metal (or anode metal) and gate metal;

depositing a drain metal on rear side of wafer after backside grinding.

* * * * *